INVENTORS C. C. CHANG
R. B. MARCUS
R. S. WAGNER
BY John C. Foy
ATTORNEY

United States Patent Office 3,687,745
Patented Aug. 29, 1972

3,687,745

LIGHT-SENSITIVE STORAGE DEVICE INCLUDING DIODE ARRAY AND METHOD FOR PRODUCING THE ARRAY

Chuan Chung Chang, Plainfield, Robert Boris Marcus, Murray Hill, and Richard Siegfried Wagner, Bernardsville, N.J., assignors to Bell Telephone Laboratories, Incorporated, Murray Hill and Berkeley Heights, N.J.

Filed Mar. 15, 1971, Ser. No. 123,970
Int. Cl. H01l 7/34, 7/44
U.S. Cl. 148—187 8 Claims

ABSTRACT OF THE DISCLOSURE

A light-sensitive target structure for use in an imaging device comprises a semiconducting wafer having a high density array of junction diodes in one surface of the wafer. The diode array is produced by: (1) forming islands of gallium, indium, thallium, lead or tin; (2) either diffusing atoms of gallium, indium or thallium directly into the wafer or selectively diffusing an impurity such as boron through molten islands of lead or tin; (3) forming an oxide layer over the entire island-bearing surface; and (4) selectively removing portions of the oxide layer over the metal islands, to expose the islands.

The method enables production of target structures having higher resolution than structures produced using standard photolithographic techniques.

BACKGROUND OF THE INVENTION

(1) Field of the invention

This invention relates to light-sensitive storage devices for producing video signals and, more particularly, to such devices containing semiconductor diode array target structures and to methods for producing such structures.

(2) Description of the prior art

U.S. Pat. 3,011,089, issued to F. W. Reynolds on Nov. 28, 1961, describes a light-sensitive storage device which can be used as a television camera tube. Its target structure is a planar n-type semiconductor substrate maintained at a fixed potential with respect to the tube cathode and having an array of isolated p-type regions on the target surface each of which forms a junction diode in the substrate. An electron scanning beam reverse-biases each successive diode to a voltage equal to the difference in potential of the substrate and the cathode. The leakage current of these diodes in the absence of light is sufficiently small that the diodes will remain in this reverse-biased condition for a time which is sufficiently long with reference to the electron beam scanning rate.

Light impinging on the n-type substrate from the side opposite the electron beam and immediately adjacent to the diodes considerably increases leakage current of the diodes by photon production of electron-hole pairs. With each successive scan by the electron beam of the diode surface, the surface is recharged to cathode potential and thus the charge it deposits on each of the p-type regions is equal to the charge removed by the leakage current during the preceding scan or frame period. The charge removed from each p-type region by the leakage current is, of course, dependent upon the light intensity to which the segment of the substrate adjacent the p-type region has been subjected. Recharging of the diode is accompanied by a current through the external circuit. This current over a frame period varies in proportion to the spatial distribution of the light intensity at successive positions of the scanning electron beam and constitutes the video output signal.

In U.S. Pat. 3,403,284, issued to T. M. Buck et al. on Sept. 24, 1968, there is described a similar device in which the target structure is modified by providing an insulating coating on the semiconductor substrate between the p-type regions thus shielding those portions of the substrate from the scanning electron beam and avoiding spurious signals which would otherwise arise from bombardment of the substrate.

Such a target structure is commonly fabricated by first preparing an n-type silicon substrate, followed by forming an oxide masking layer on one surface of the substrate, followed by etching a regular array of holes in the oxide masking layer using photolithographic techniques. P-type regions are then formed by diffusing a suitable impurity such as boron into the substrate surface exposed by the holes in the oxide masking layer. This oxide layer is subsequently left intact to serve as the insulating layer described above.

It has been recognized by some that it would be advantageous to be able to form a diode array without the use of photolithographic techniques. For example, in C.R. Acad. Sc., Paris, t. 267 (Sept. 23, 1968), there is described a method for forming a light-sensitive semiconductor diode array target involving the formation of a random array of islands of aluminum on n-type silicon and the diffusion of aluminum from the islands into the silicon. Unfortunately, such a system results in video output signals of less than satisfactory quality.

The possibility of being able to fabricate such diode array structures without the use of photolithography has prompted further investigation into other material systems which might prove more suitable to such an approach.

SUMMARY OF THE INVENTION

In accordance with the invention, it has been discovered that island array target structures result in good quality video output signals when an insulating layer is provided on the semiconducting substrate surface between the diodes, and that such structures may be fabricated when the metals gallium, indium, thallium, lead or tin are used as the island materials. Diodes are produced by forming an island array of one of these metals on a substrate such as n-type silicon and either diffusing atoms of gallium, indium or thallium directly into the substrate or selectively diffusing an impurity such as boron through molten islands of lead or tin. After diode formation, an insulating oxide layer is formed over the entire island-bearing surface followed by selective etching to remove portions of oxide from the surface of the islands. The resultant light-sensitive target structure is suitable for use in a variety of imaging devices, such as television camera tubes, imaging electron microscopes, imaging X-ray diffractometers and other imaging devices which utilize radiation capable of producing electron-hole pairs.

In addition to the critical processing steps described above, various additional steps may be carried out. In a preferred embodiment, a semi-insulating layer is formed over the insulating oxide layer to aid in removing charges from the insulating layer and thus prevent unnecessary charge buildup in the structure.

Further processing may include such steps as doping portions of the silicon substrate highly n-type to facilitate electrical connection thereto, and to reduce dark current generation at the back face of the structure.

DETAILED DESCRIPTION

Figure 1:
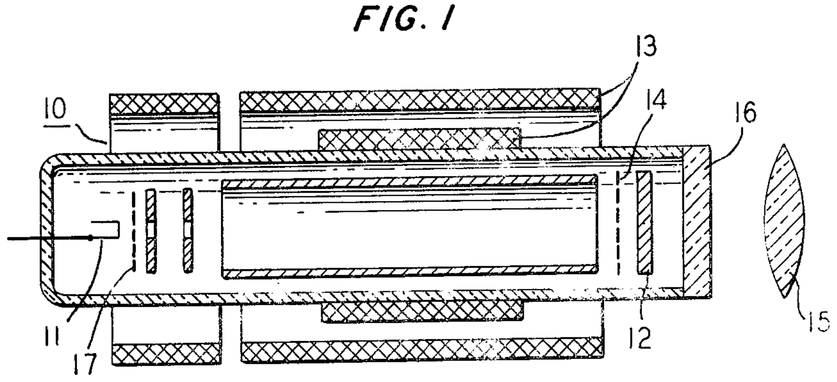
FIG. 1 is a schematic illustration of a television camera tube in accordance with one embodiment of the invention.

FIG. 1 shows a television camera tube 10 comprising a cathode 11 and grids 14 and 17 for forming and projecting an electron beam toward a target structure 12. Coils 13 deflect the electron beam in a known manner so that it scans a target surface on the structure 12 in a line and frame sequence. A lens 15 projects incoming light through a transparent face plate 16 and images it on the light-sensitive surface of the target structure 12.

Figure 2:
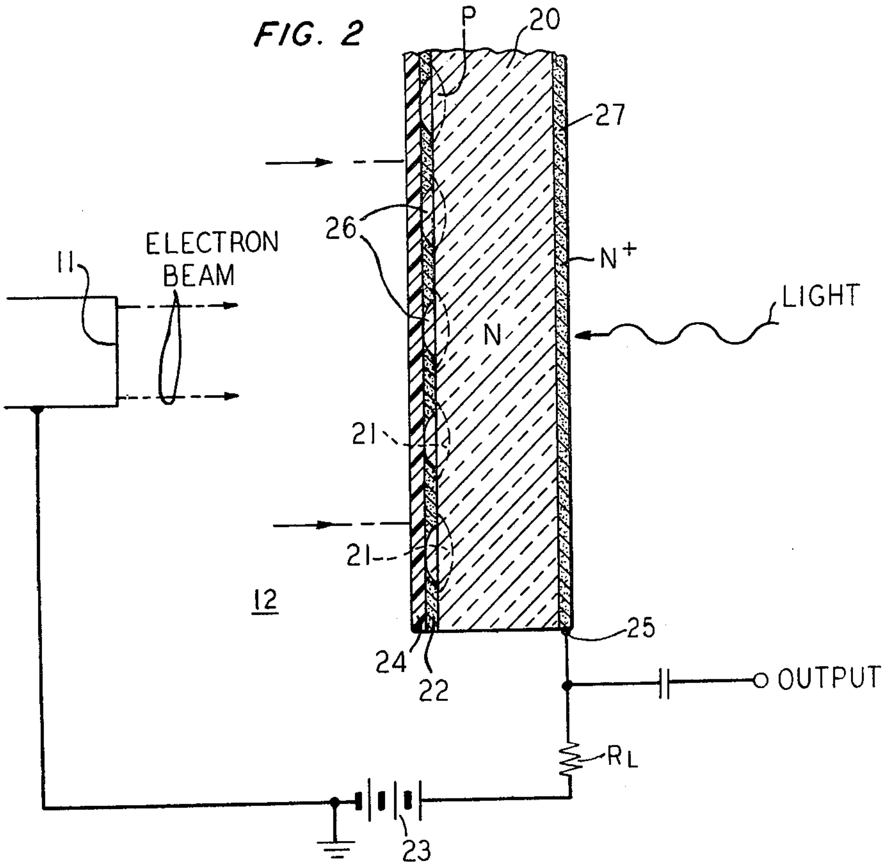
FIG. 2 is an enlarged view of a portion of the tube illustrated in FIG. 1, including part of a cross section of a target structure.

FIG. 2 shows one embodiment of the invention in which the target structure 12 comprises a semiconductor wafer, the major portion of which is an n-type substrate 20, and metal islands 26 distributed across the target surface, with isolated p-type regions 21 forming a matrix of p-n junction diodes in the target surface of the semiconductor under the metal islands 26. Layer 22, an insulating material, covers the target surface of the n-type substrate between the metal islands, thus exposing only these islands to the electron beam. Layer 22 slightly overlaps the edges of the p-type regions underlying the islands to shield the n-type region from the beam and to protect the p-n junctions against possible shorting. The substrate 20 is maintained at a positive potential with respect to the cathode, by means of a highly doped n+ layer 27 connected through a suitable contact 25 to a load resistance $R_L$, which in turn is connected to a battery 23. A semi-insulating layer 24 is deposited over the insulating layer 22 and metal islands 26. Layer 24 has a resistivity within the range of about $10^8$ and $10^{11}$ ohm centimeters. Layer 24 has the primary function to distribute charge from the insulating layer 22 to the nearest p-type region 21.

The spacing between p-type regions 21 is made smaller than the diameter of the electron beam so that as the beam scans the target surface, it impinges simultaneously on several islands covering the p-type regions. The size of the islands overlying the p-type regions typically may range from about 10 A. to 10 microns and the island density may range from $10^6$ to $10^{12}$ per square centimeter, when produced in accordance with the techniques to be described herein.

Electrons which miss the islands will be stopped by the insulating layer 22 or repelled by the charge on the layer 22. Those electrons which are collected by layer 22 will be conducted slowly by the semi-insulating layer 24 toward the nearby p-type regions. This effect occurs over a sufficiently long period of time so that image resolution within each frame period is not appreciably impaired.

The method of fabricating the target structures may in preferred embodiments include several steps which are similar or identical to those used in the fabrication of target structures by photolithographic techniques, but nevertheless the method involves significant departures from these prior art techniques, in the essential steps of diode array formation, and insulating layer formation. The first essential step of such fabrication involves forming a random array of metal islands on the silicon target surface.

The particular metal chosen is critical to the successful practice of the invention, since it must not only exhibit the requisite surface energy and melting point for island formation, but also must exhibit the electrical characteristics suitable for diode formation. Thus, for diode formation by diffusion of the island material itself, the metal must have the ability to dope the n-type substrate p-type, while avoiding substantial reduction of minority carrier lifetime in the substrate, and must have a diffusion constant low enough to permit dense packing of the diodes while maintaining their individual isolation from the rest of the array. Where the diodes are to be formed by diffusion of an impurity through the molten islands, the metal must have a low diffusion coefficient and substantially neutral electrical characteristics. In addition, it is essential that the oxide formed on the islands be more easily removable (such as by chemical etching) than the oxide formed on the substrate, so as to facilitate removal for exposure of the islands to the scanning electron beam.

In general, the island arrays may be formed by one of two methods. In the first method, a metal layer is initially formed upon the substrate. Following this, the layer thus formed is heated to a temperature sufficient to cause melting of the layer and wetting of the substrate surface, leading to agglomeration of the metal into separate islands of material.

A second method of island formation is by direct deposition upon the substrate under such conditions that nucleation and some growth of the island material occurs, but growth is curtailed prior to coalescence of these islands into a contiguous film. Such formation may be at any temperature above room temperature. The surface density of the nuclei formed generally increases with decreasing substrate temperature and increasing deposition rate. Increasing the time of deposition increases the size of the islands. This method is in general preferred over the previous method in those cases in which it is desired to have a greater degree of control over island size and density.

It is characteristic of the inventive technique that islands of smaller size and higher packing density than is possible using photolithographic techniques can be achieved. It will be appreciated by those skilled in the art that the technique thus results in significant increases in image resolution of the final target structure over those obtainable by such prior art techniques. In order for such high resolution target structures to be successfully fabricated, extremely thin substrate layers may be required. Such thin layers, in some cases having thicknesses much less than one micron, are within the present skill of the art to produce by techniques such as ion milling or electrochemical etching. Details of these techniques are known and thus do not form a necessary part of this description.

Figure 3:
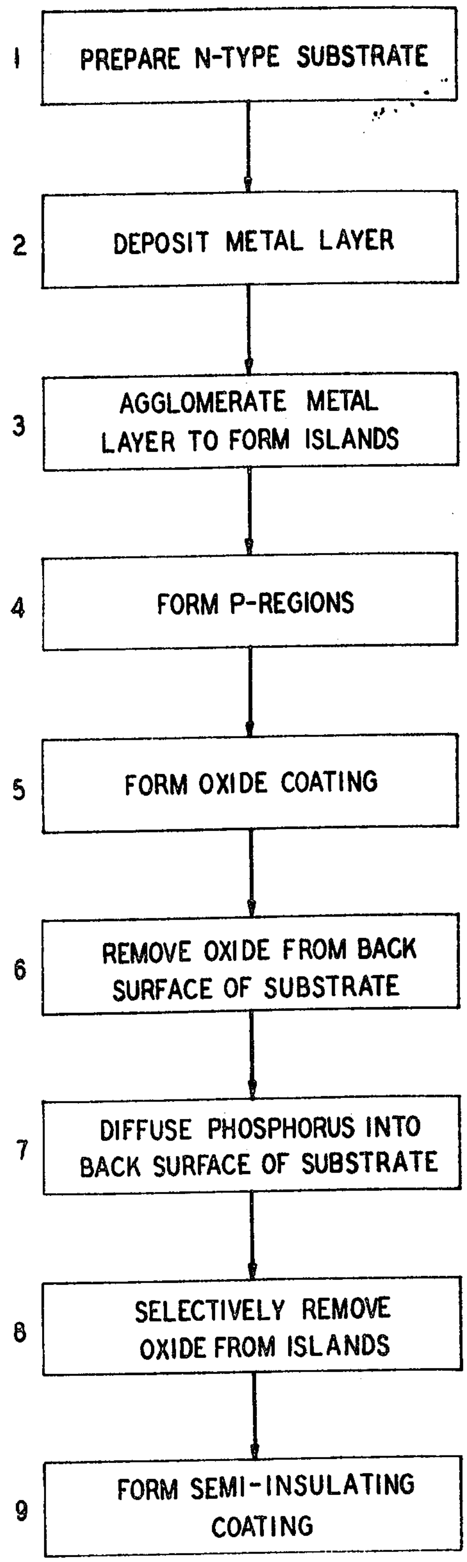
FIG. 3 is a block diagram showing one sequence of steps for making the target structure of FIG. 2.

Referring now to FIG. 3, there is shown a block diagram of the major processing steps required for the fabrication of a preferred embodiment of the target structure. Steps 1, 5, 6 and 8 have been described in detail elsewhere, for example, in the patent to Buck et al. cited above and in U.S. Pat. 3,419,746, issued to M. H. Crowell et al. on Dec. 31, 1968. However, a brief description of these procedures will be given herein to aid the practitioner.

Step 1 calls for preparation of the n-type substrate, typically silicon, and involves polishing, thinning and cleaning in accordance with standard techniques. Further preparation to remove an adherent oxide layer as described herein may be desired.

Step 2 calls for deposition of the metal layer, and is carried out by any suitable technique, such as vapor deposition or sputtering. The thickness of the metal layer should in general be kept below 200 A. in order to promote formation of substantially uniform island densities and sizes. A thickness of up to about 50 A. is preferred for this purpose. If the resultant islands are too small, their sizes may be increased by subsequentially adding material thereto, such as by vapor deposition.

In general, one of the metals gallium, indium or thallium may be preferred as the island material for ease of fabrication in that they are shallow acceptors and thus, form p-type regions directly by diffusion into the silicon during or subsequent to island formation, while the metals lead and tin are neutral species so that subsequent diode formation must be by separate selective diffusion of a suitable dopant such as boron (e.g., in the form of diborane gas) through the liquid islands of metal. However, if highest resolution of the target structure is desired, then lead or tin may be preferred for their low diffusion coefficients thus enabling high surface density of islands.

The third step is heating of the metal layer to cause agglomeration. The metal layer must be heated to a temperature sufficient to wet the substrate surface in order to cause agglomeration. It has been found that a thin oxide layer or film usually present on the surface of silicon even after conventional cleaning and polishing, necessitates heating the metal layer to 900° C. to 1200° C. for about two to four minutes. The oxide film may be removed to enable the achievement of agglomeration at lower temperatures. The film may be removed prior to formation of the metal layer by treatment in vacuum, for example, by sputtering the oxide from the surface or by heating the surface at about 1100° C. to 1200° C. for two to six minutes. After such treatment, the temperatures required for agglomeration in general range from above the melting point of the metal to about 1200° C. Melting points are approximately as follows: For gallium, 30° C.; for indium, 156° C.; for thallium, 304° C.; for lead, 330° C.; and for tin 232° C. Too high a temperature may result in loss of material by vaporization, or the islands may coalesce due to unfavorable changes of the surface energies of the island material and substrate material. Agglomeration will usually occur within this temperature range within two to four minutes.

The fourth step is formation of the p-type regions. In the case of gallium, indium or thallium as the island material, the p-type regions will be formed by diffusion of the island material into the silicon. In general, carrying out the agglomeration step at a temperature above 600° C. will result in simultaneous diffusion of the island material to form the p-type regions. However, carrying out the agglomeration step at a temperature below 600° C. may render necessary a subsequent heating step at from 600° C. to 1200° C. for from one to six minutes in order to achieve adequate diffusion to form the p-type regions.

If lead or tin is chosen as the island material, then the p-type regions must be formed by separate diffusion of a suitable dopant, as was mentioned above. In order for the dopant to diffuse through the islands at a much greater rate than it diffuses through the unmasked substrate surface, the dopant must be introduced in the gaseous state. Several suitable dopant species and carrier gases are known, such as boron in the form of diborane gas or boron tetrachloride gas. The temperature of the substrate during diffusion of the dopant should be such as to maintain the islands molten but should not exceed a temperature at which appreciable amounts of the islands could be lost through volatilization or coalescence. The time of diffusion should be sufficient to achieve well-defined but isolated p-type regions. Typical conditions for diffusion are from 900° to 1200° C. for from one to five minutes. Since these conditions are also suitable for achieving agglomeration of the tin or lead layer, it has been found convenient to introduce the dopant gas during the agglomeration step so as to expedite processing. After diffusion, any impurity layer which may have accumulated on the substrate surface may be removed with a suitable solvent or etchant, as is known.

The fifth step is formation of the insulating oxide layer. In general, it has been found satisfactory to form this layer by steam or dry oxidation. It is preferred to this end to steam oxidize by heating the island-bearing substrate in the presence of steam at a temperature of from about 950° to 1050° C. for a time of about 10 to 50 minutes, resulting in a layer thickness of from 0.1 to 0.55 micron.

The sixth step is removal of the insulating layer from the back surface of the substrate. This may be carried out by any known technique, such as chemical etching. A dilute hydrofluoric acid solution is preferred for this purpose. Care should be taken during this step to insure that the insulating layer overlying the front surface of the substrate and the islands is not removed.

The seventh step is diffusion of an n-type impurity into the back surface of the substrate in order to form a highly n-type layer so as to (1) minimize leakage currents at this surface and (2) provide ohmic contact to the substrate, as is known. Typically, phosphorus may be diffused to a depth of one micron or less. Glass or other residue formed during this diffusion may be removed by a suitable solvent, as is known.

The eighth step is removal of the oxide layer from the surfaces of the islands such as by selective etching. The purpose of this step is to expose at least a portion of the islands to the scanning electron beam so that the diode array may be charged to its full reverse-bias potential during each frame period. It is significant then that where tin is chosen as the island material, such removal may be omitted due to the relatively high degree of electrical conductivity of tin oxide, as compared to the other island metal oxides.

Where removal is by selective etching, it may in general be carried out by using any of a number of known etchants which will attack the metal oxides but not the substrate oxide. Such etchants include solutions of the strong acids, including hydrochloric acid, nitric acid and sulphuric acid, and the strong bases, including sodium hydroxide and ammonium hydroxide, depending on the type of oxide formed on the islands. Hydrofluoric acid is, of course, not suitable, since it would attack silicon dioxide. Hydrochloric acid will etch all of the island oxides except lead oxide. Suitable conditions for etching are the use of a solution of 40 to 90 percent by weight of concentrated acid or base to one part water for one to four hours at room temperature. Shorter etching times may be achieved by use of more concentrated solutions or higher solution temperatures or both, as is well known in the art.

In step 9, an additional semi-insulating layer is formed upon the insulating oxide layer and exposed portions of the islands. Such a layer is known to result in improved quality of the video output signal of diode array target structures, and thus its formation constitutes a preferred embodiment of the invention. This semi-insulating layer could be one of any number of materials such as gallium arsenide, antimony trisulphide, hafnium tantalum nitride, mixtures of these or other materials having similar conductivities. The layer is formed according to techniques well known in the semiconductor art, such as vapor deposition or sputtering.

Figure 4:
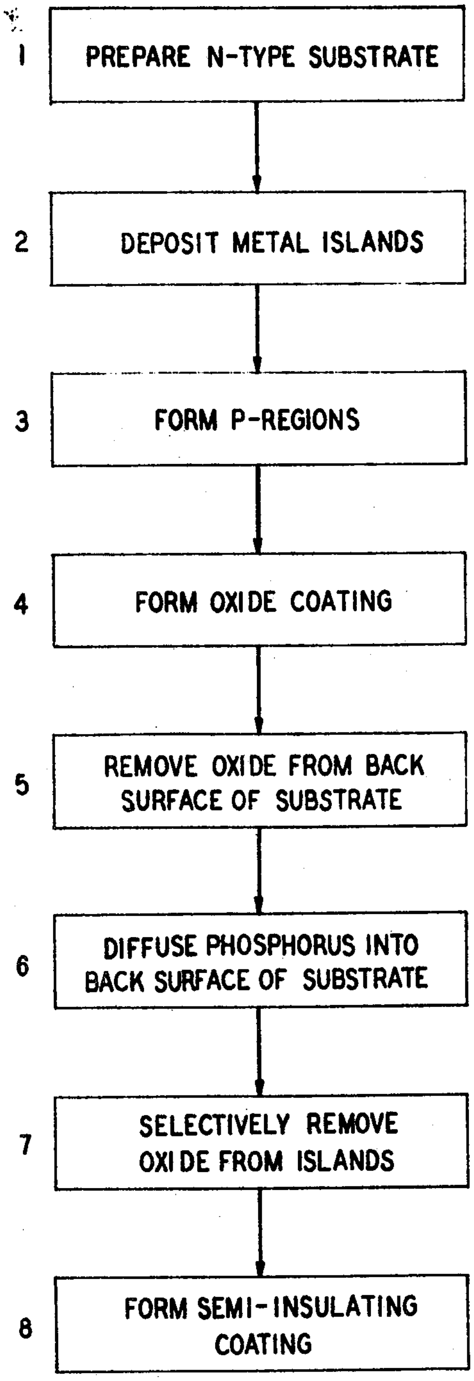
FIG. 4 is a second block diagram showing a second sequence of steps for making the target structure of FIG. 2.

FIG. 4 is a block diagram showing a second method for fabrication of a target structure. This method differs from the method of FIG. 3 only in that the island array is formed by a single deposition step rather than by the two-step process described above. Typical substrate temperatures for such island array formation are from above the melting point of the metal to about 1200° C. As previously noted, where the substrate surface has not been previously treated to remove oxide film, temperatures required to deposit the metals thallium, lead and tin range from 900° C. to 1200° C. Deposition time is generally from one to five minutes.

Example

An n-type silicon wafer was cleaned and polished. Following this, a layer of tin was vacuum evaporated upon one surface of the silicon and the resultant tin layer was heated at a temperature of 950° C. for three minutes. During this time there was simultaneously introduced into the vacuum chamber 100 parts per million of diborane gas in hydrogen at a flow rate of about 1200 cubic centimeters per minute. At the end of this time, an island array had formed, which array had a density of about $10^7$ per square centimeter. The islands averaged one-half to one micron in size. The array-bearing substrate was then heated at a temperature of 1050° C. for about fifty minutes in the presence of steam, resulting in a silicon dioxide layer about one micron in thickness. The portion of this layer which had formed on the back of the substrate was removed by contacting it with a solution containing 30 percent of hydrofluoric acid for about 20 seconds. Phosphorus was then diffused into the back surface of substrate at a temperature of about 925° C. for about five minutes, resulting in an n+ layer about 0.25 micron thick. Oxide was then selectively removed from the surfaces of the tin islands by contacting the oxide with a three-to-one solution of concentrated hydrochloric acid and water for about four hours at room temperature. Following this, electrical contact was made to the n+ layer. The resultant target structure was placed in a laboratory apparatus capable of producing a visual display of a light pattern impinging upon the target surface. In this manner a well-defined test pattern was observed to be accurately reproduced with good image resolution by the target structure.

The invention has been described in terms of a limited number of embodiments. Other embodiments are contemplated. For example, the target structure is useful in any imaging device which utilizes radiation capable of producing electron-hole pairs at the back surface of a target, such as electrons, X-rays and light waves.

In addition, it is stressed that the inventive concept is basically one of producing diode arrays without the need of photolithographic techniques. Consequently, various other structures based upon island arrays may be envisioned by those skilled in the art. Two specific examples of such additional structures are but illustrative. Both structures utilize the well-known concepts of VLS and SLV-VLS crystal growth such as are described in U.S. Pat. 3,346,414, issued to W. C. Ellis et al. on Oct. 10, 1967; and 3,493,431, issued to R. S. Wagner on Feb. 3, 1970.

The first structure is an array of whiskers bearing p-n junctions formed using VLS techniques. Whiskers of n-type silicon may be grown to any desired length up to one centimeter. At some point a p-type impurity is introduced and growth continues, thus resulting in the formation of a p-n junction within the whisker. Growing such whiskers at the site of each island of a metal island array results in an elevated array of junction diodes within an array of whiskers. Any suitable substrate may be used to support this array so long as it is compatible with the envisioned device use. Such an elevated diode array results in several operating advantages including increased collection efficiency of electrons from the scanning electron beam and increased resolution of the image due to close spacing of the whiskers. In the latter case the whiskers can be spaced closer than the distance over which the p-type dopant can diffuse during any subsequent high temperature processing treatment, since the p-type regions are well removed from the substrate surface so that a p-type "skin" cannot form during such treatment.

A second type of structure comprises an array of junction diodes buried beneath the surface of a substrate. Such an array may be produced by growing negative whiskers from an island array in accordance with the technique described in copending application Ser. No. 714,526 filed on Mar. 20, 1968, issued on July 13, 1971 as Patent No. 3,592,706. The resultant structure has the advantage of reduction in spurious signals during operation.

What is claimed is:

1. A method for producing a diode array target structure characterized in that said method comprises (1) forming islands of a metal selected from the group consisting of thallium, indium, gallium, tin and lead on one surface of an n-type semiconductor substrate;

(2) introducing p-type impurities into regions of the substrate under the islands, so as to form p-n junction diodes under the islands;

(3) forming an oxide layer on the exposed surfaces of the substrate and islands; and (4) selectively removing the oxide layer so as to at least partially expose the islands leaving oxide between the islands on the substrate.

2. The method of claim 1 in which the metal is selected from the group consisting of thallium, indium and gallium, and in which p-type impurities are introduced into the substrate by diffusing atoms of the metal into the substrate.

3. The method of claim 1 in which the metal is selected from the group consisting of lead and tin and in which p-type impurities are introduced into the substrate by heating the wafer to a temperature above the melting point of the islands and introducing a p-type dopant in the gaseous state over the molten islands.

4. The method of claim 3 in which the p-type dopant is boron.

5. The method of claim 1 in which the islands are formed by first forming a continuous layer of the metal on the substrate followed by heating the wafer and layer so as to cause agglomeration of the layer into islands.

6. The method of claim 5 in which the surface of the substrate is treated in vacuum prior to formation of the metal layer, so as to remove any oxide film which may be present on the surface, and in which the substrate and metal layer are heated to a temperature of from above the melting point of the metal to 1200° C. for from 2 to 4 minutes.

7. The method of claim 1 in which the islands are fromed by depositing the metal onto the substrate.

8. The method of claim 7 in which the surface of the substrate is treated in vacuum prior to formation of the metal layer, so as to remove any oxide film which may be present on the surface, and in which deposition is carried out at a temperature of from the melting point of the metal to 1200° C. for from 1 to 5 minutes.

References Cited

UNITED STATES PATENTS 3,415,681 12/1968 Burgess ............ 117—217
3,609,375 9/1971 Bloom ........... 317—235 F L. DEWAYNE RUTLEDGE, Primary Examiner J. M. DAVIS, Assistant Examiner U.S. Cl. X.R.

117—210, 217; 148—188; 315—10; 317—235 N